United States Patent [19]

Thomas

[11] Patent Number: 5,402,012
[45] Date of Patent: Mar. 28, 1995

[54] SEQUENTIALLY CLOCKED DOMINO-LOGIC CELLS

[75] Inventor: Steven D. Thomas, Palmdale, Calif.

[73] Assignee: VLSI Technology, Inc., San Jose, Calif.

[21] Appl. No.: 48,671

[22] Filed: Apr. 19, 1993

[51] Int. Cl.[6] .......................................... H03K 19/096
[52] U.S. Cl. ........................................ 326/97; 326/53; 326/21
[58] Field of Search ............... 307/443, 452, 453, 472, 307/480–481

[56] References Cited

U.S. PATENT DOCUMENTS

| | | | |
|---|---|---|---|
| 4,054,788 | 10/1977 | Maitland et al. | 307/472 X |
| 4,570,084 | 2/1986 | Griffin et al. | 307/452 |
| 4,697,105 | 9/1987 | Moy | 307/443 X |
| 4,841,174 | 6/1989 | Chung et al. | 307/443 X |
| 5,015,882 | 5/1991 | Houston et al. | 307/452 |
| 5,121,003 | 6/1992 | Williams | 307/452 |
| 5,124,572 | 6/1992 | Mason et al. | 307/480 X |
| 5,258,666 | 11/1993 | Furuki | 307/452 X |

OTHER PUBLICATIONS

Lu, Fang and Henry Samueli; "A 140-MHZ CMOS Bit-Level Pipelined Multiplier-Accumulator Using a New Dynamic Full-Adder Cell Design"; 1990 Symposium on VSLI Circuits IEEE 1990; pp. 123-124.

Lu, Fang and Henry Samueli; "A 200-MHz CMOS Pipelined Multiplier-Accumulator Using a Quasi--Domino Dynamic Full-Adder Cell Design"; IEEE of Solid-State Circuits, vol. 28, No. 2, Feb. 1993; pp. 123-132.

Excerpts from Chapter 6 of a textbook entitled *The Design and Analysis of VLSI Circuits*, Lance A. Glasser et al, 1985, which relate to a section entitled "Domino and Rippling Logic", including FIGS. 6.16 to 6.19 (6 pages).

*Primary Examiner*—David R. Hudspeth
*Attorney, Agent, or Firm*—Burns, Doane, Swecker & Mathis

[57] ABSTRACT

The present invention relates to an implementation of domino logic using a logic cell which is not limited to the use of positive logic functions, and which can be implemented using MOS technology. A significant feature of the present invention relates to use of a single clock cycle to generate separate clock phases for a first function (e.g., carry function of a full-adder logic cell) and a second function (e.g., sum function in the full-adder logic cell). The separate clock phase used to gate the second function corresponds to a delayed version of the clock phase used to gate the first function, wherein the clock delay corresponds to a delay through the first function. In one exemplary embodiment, the delay can be made equal to that of the first function by using circuitry identical to that of the first function to create the delay period.

18 Claims, 5 Drawing Sheets

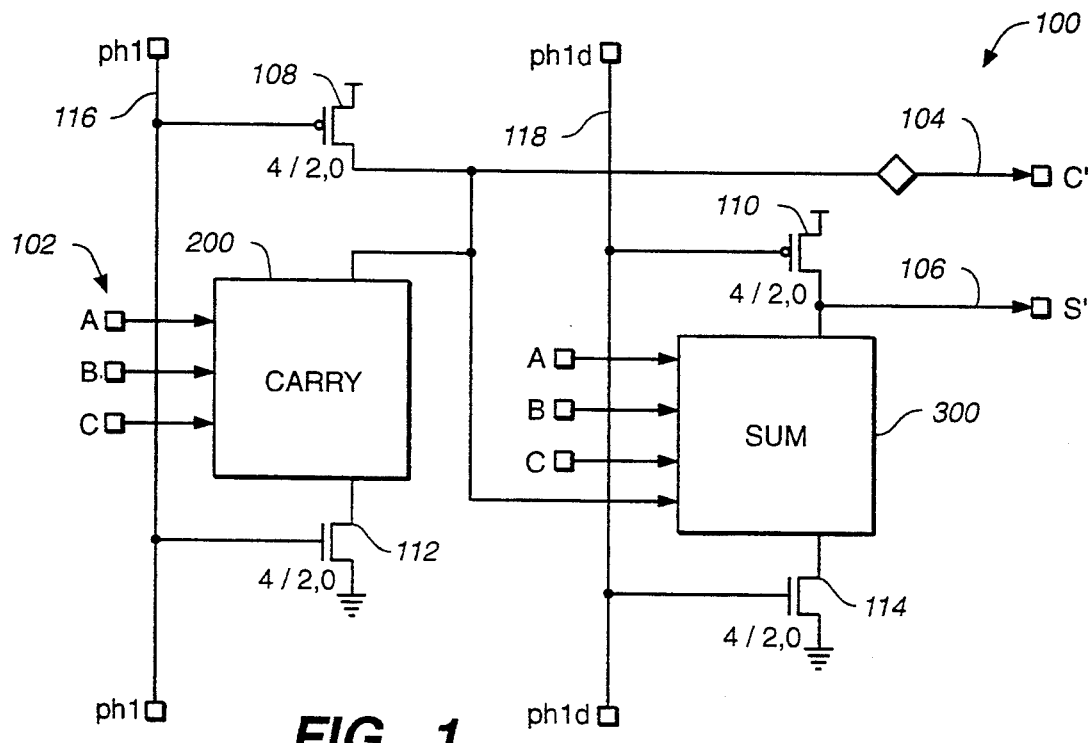
FIG._1
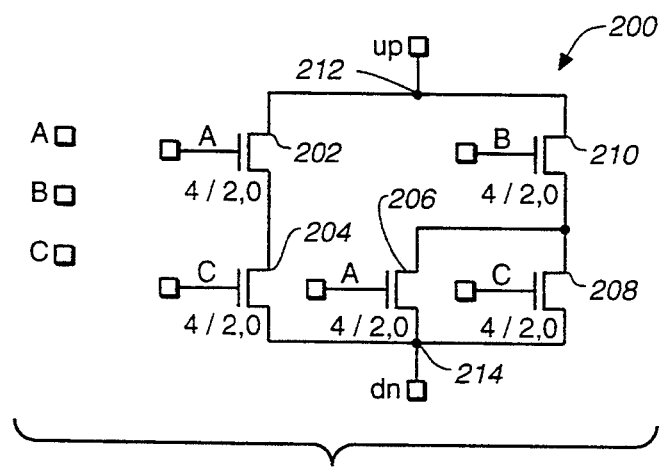
FIG._2

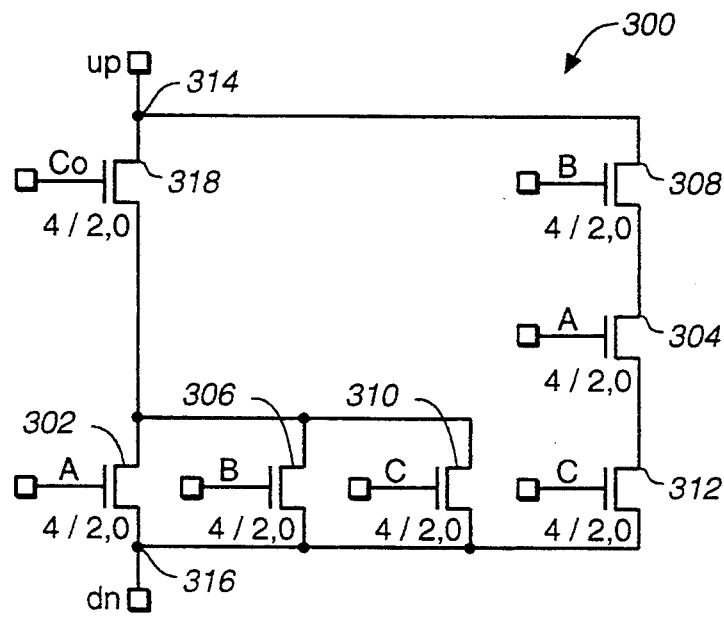
FIG._3
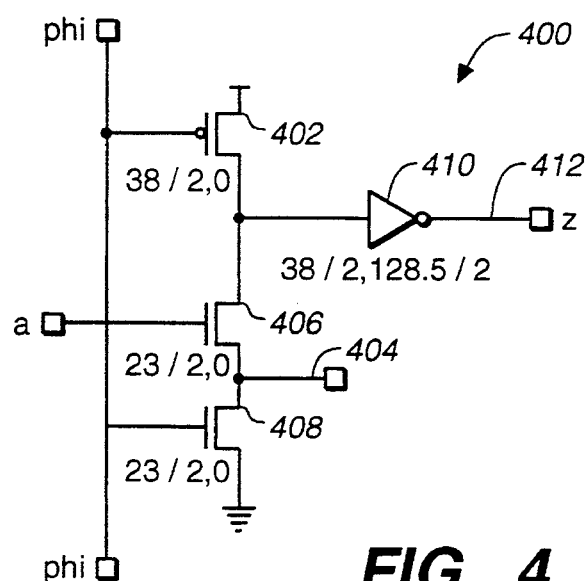
FIG._4

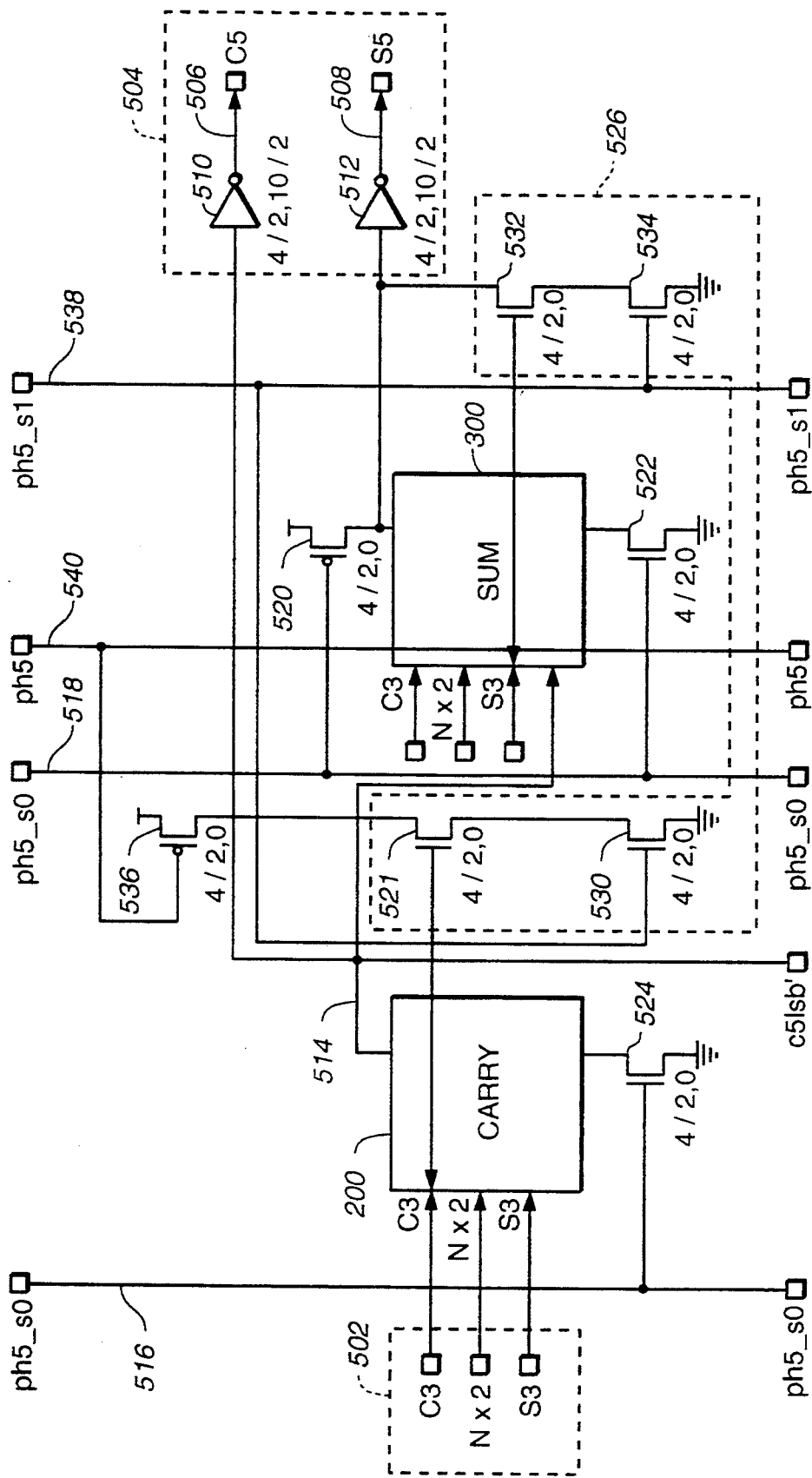
FIG._5

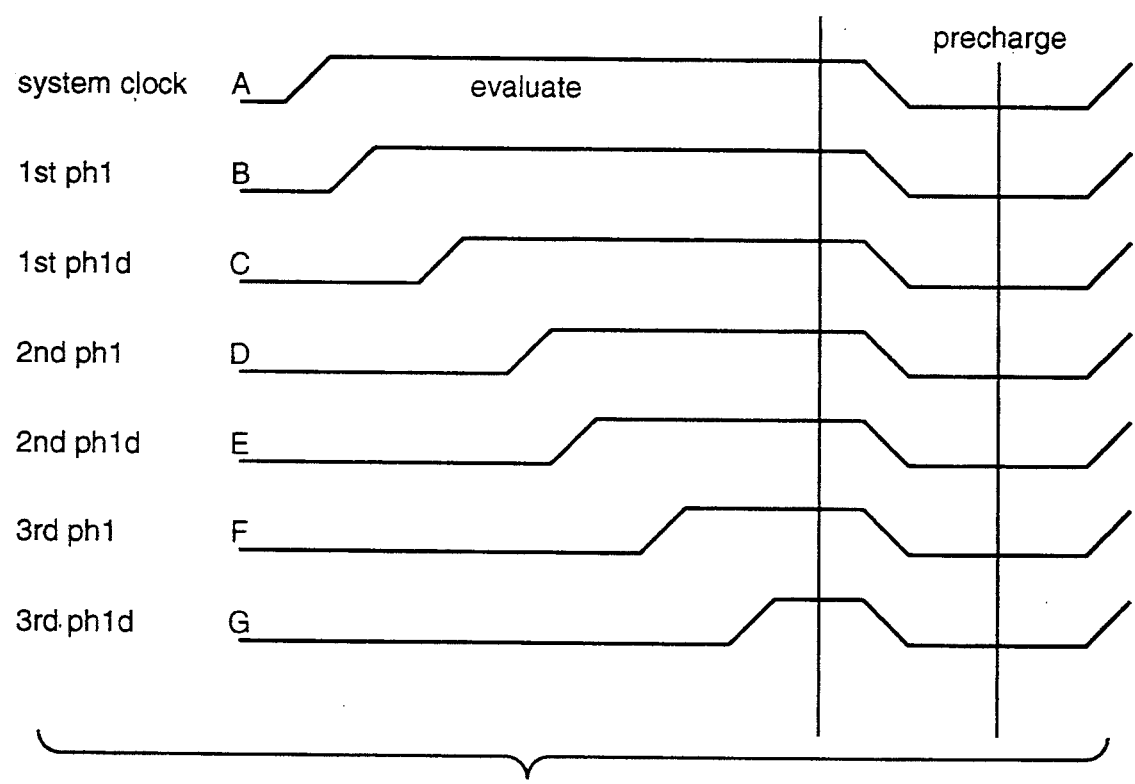
FIG._6A

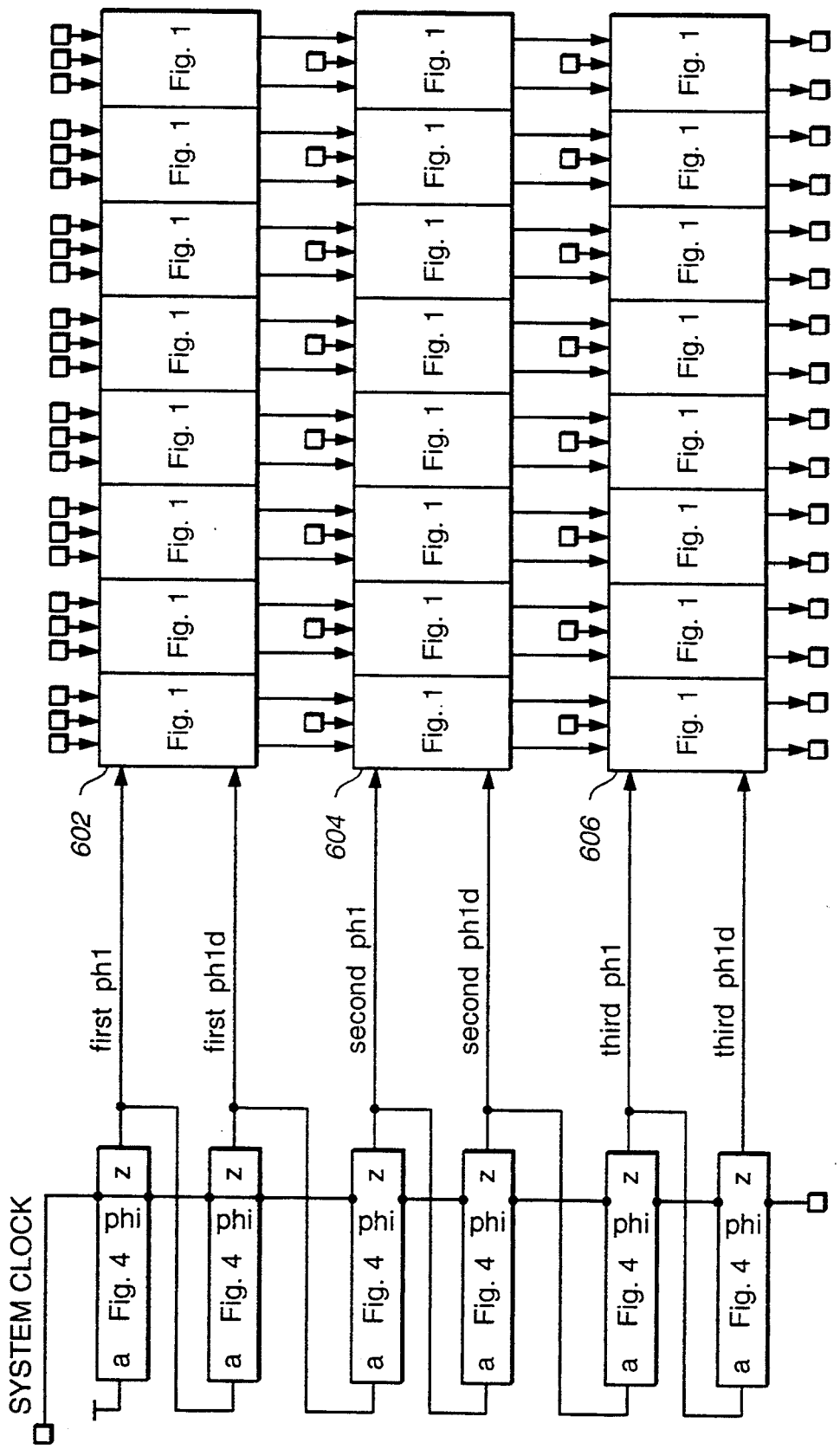
FIG._6B

SEQUENTIALLY CLOCKED DOMINO-LOGIC CELLS

BACKGROUND OF THE INVENTION

1. Field of the Invention

The present invention relates generally to digital signal processing, and more particularly to processing of digital signals using a logic cell suitable for a domino logic implementation.

2. State of the Art

Domino logic has achieved widespread use for integrated circuits which include regular arrays. With domino logic, a standard cell formed with a plurality of transistors represents a stage. A plurality of the stages can then be connected in series for implementing domino logic.

For example, a multi-input AND function or a multi-input OR function can be implemented using domino logic. In the case of a multi-input AND function, a two-input AND gate can be implemented as a single stage. A plurality of such stages can then be cascaded together in series to implement the multi-input AND function. A signal input to the first stage is evaluated therein, and the first stage then produces an output which propagates to the second stage where outputs of the first stage are evaluated. The second stage then produces additional outputs which in turn are propagated to the third stage wherein they are evaluated, and so on.

A significant feature of domino logic is that signals can propagate through the various stages without being separately clocked at each stage. Thus, a single clock cycle can be used to initiate the propagation of input signals through a plurality of cascaded stages which collectively represent a relatively complex function. This avoids the need for high speed clocks to implement relatively complex functions, by avoiding the need for plural clock cycles to process the signal inputs. At the same time, the evaluation of the signal inputs within a single clock cycle provides relatively fast signal processing.

Despite these advantages, domino logic has been limited in its applicability. For example, where domino logic is implemented using MOS technology, integrated circuits such as adder circuits cannot be implemented because they require the use of negative logic functions (e.g., NOR, NOT, NAND functions). On the contrary, conventional MOS implemented domino logic is limited to use of positive logic functions. As referenced herein, positive logic refers to the use of non-inverting gates to implement a function (e.g., AND, OR and so forth). Gates such as NAND, NOR or NOT gates constitute negative logic and are therefore not appropriate for use with MOS implemented domino logic.

Given the relatively low power requirements of MOS technology, efforts have been directed to cascading MOS implemented adders to achieve the features of domino logic. Accordingly, various solutions have been proposed to avoid the limits of implementing domino logic with MOS circuitry. For example, an article entitled "A 140-MHz CMOS Bit-Level Pipelined Multiplier-Accumulator Using A New Dynamic Full-Adder Cell Design", Lu et al, 1990 Symposium on VLSI circuits (Hawaii 1990), discloses the implementation of a full-adder circuit using MOS circuitry in a pipelining technique. The pipelining technique proposed by the Lu et al document does not constitute a true domino logic implementation since the disclosed circuitry requires a separate clock cycle for each cascaded stage of the circuit.

Referring to FIG. 2 of the Lu et al document, it can be seen that the pipelining technique described therein involves dissecting an addition operation into two basic functions: a first function for providing a carry output as a combination of inputs labeled $A_i$, $C_i$, and $S_i$; and a second function for providing a sum output as a combination of the aforementioned three inputs plus an inverted carry output from the carry function. Both of these functions are implemented using MOS technology; the carry function labelled "C-block" is implemented with p-channel MOS transistors and the sum function labelled "S-block" is implemented with n-channel MOS transistors.

Despite its ability to include negative logic functions, the FIG. 2 implementation of the Lu et al document results in significant drawbacks. These drawbacks prevent implementation of domino logic using the logic cell disclosed therein.

MOS implementation of domino logic requires compliance with specific rules. For example, instabilities at the inputs of each cascaded stage can not be tolerated.

More particularly, all inputs of an n-channel stage are permitted to transition from logic 0 to logic 1 or to remain stable at their previous value (i.e., logic 0) during an evaluation phase to turn on an n-channel transistor of a subsequent cascaded stage. Any transition from logic 1 to logic 0 during the evaluation phase constitutes an illegal input signal condition for the subsequent cascaded stage. On the contrary, for a p-channel stage, all inputs are permitted to transition from a logic 1 to a logic 0 or to remain stable at their previous values (i.e., logic 1) during an evaluation stage (i.e., a 0 is required to turn on a p-channel transistor of a subsequent stage). Any transition from logic 0 to logic 1 during the evaluation phase constitutes an illegal input condition for a subsequent, cascaded p-channel stage.

To address the instabilities associated with the use of negative logic functions, a 4 transistor latch is provided at the logic cell outputs of both the S-block and the C-block in FIG. 2 of the Lu patent. Latching of the output signals So and Co stabilizes the logic condition of these output signals to provide a subsequent stage with legal input signals from a previous stage. However, both the clock signal "CLK" used for pre-charge and an inverted clock signal labeled $\overline{CLK}$ are required for gating the latch to transfer the output signals from the first stage to the subsequent stage. Further, plural clock cycles are required for propagating signals through plural cascaded stages of the Lu et al implementation. This reflects the pipeline technique used by Lu et al to propagate signals through the circuit.

This pipelining technique of the Lu et al document poses significant drawbacks to the circuit designer. For example, a relatively high speed clock (e.g., 140 MHz) is required to implement the large number of clock cycles necessary for propagating input signals through sequential stages. Further, the need for a separate clock cycle at each stage requires that the clock signal be routed to a large portion of the circuitry, thus increasing overall power requirements of the integrated circuit. Further, the increased circuitry required for the output latches and for the routing of the clock imposes serious area constraints on the overall design which lead to increased size and costs.

Accordingly, it would be desirable to provide an implementation of domino logic which is not restricted to the use of positive functions, yet which can realize significant advantages of true domino logic whereby a single clock cycle can be used to evaluate a relatively complex function.

SUMMARY OF THE INVENTION

The present invention relates to an implementation of domino logic using a logic cell which is not limited to the use of positive logic functions, and which can be implemented using MOS technology. A significant feature of the present invention relates to use of a single clock cycle to generate separate clock phases for a first function (e.g., carry function of a full-adder logic cell) and a second function (e.g., sum function in the full-adder logic cell). The separate clock phase used for the second function corresponds to a delayed version of the clock phase used for the first function, wherein the clock delay corresponds to a predetermined delay (e.g., the delay through the first function). In one exemplary embodiment, the delay can be made equal to that of the first function by using circuitry identical to that of the first function to establish the delay period.

The present invention can thus provide a MOS implemented logic cell, such as a full-adder cell, which has minimal circuitry, and which requires a relatively small area on an integrated circuit. Further, the present invention can provide a MOS implemented logic cell as a stage which can be cascaded with other stages such that all of the cascaded logic cells can perform computations during a single clock cycle. An adder cell designed in accordance with the present invention exploits the inherent power savings associated with the use of MOS domino logic, without requiring the use of pipeline latches such as those described in the Lu et al document.

Generally speaking, the foregoing features are achieved in accordance with the present invention using an apparatus for logically combining digital logic values which comprises an input means for receiving input signals to be evaluated, means for performing a first function, means for performing a second function, means for providing first and second clock signals, said clock signal providing means including means for providing said first clock signal to said first function performing means, and means for providing said second clock signal to said second function performing means; and means for delaying one of said first and second clock signals relative to the other of said first and second clock signals by a delay time greater than or equal to a delay time of said first function performing means.

BRIEF DESCRIPTION OF THE DRAWINGS

The present invention can be further understood with reference to the following description and the appended drawings, wherein like elements are provided with the same reference numerals. In the drawings:

FIG. 1 shows an exemplary MOS implemented full-adder cell designed in accordance with an exemplary embodiment of the present invention;

FIG. 2 shows an exemplary carry function performing means for use with the FIG. 1 cell;

FIG. 3 shows an exemplary sum function performing means for use with the FIG. 1 cell;

FIG. 4 shows an exemplary delay means for producing a delayed version of a clock signal;

FIG. 5 shows an exemplary implementation of a circuit which includes use of the FIG. 1 cell;

FIG. 6a shows clock waveforms associated with a plurality of cascaded logic cells; and FIG. 6b illustrates the use of a clock driver circuit for clocking a plurality of cascaded logic cells.

DETAILED DESCRIPTION OF THE PREFERRED EMBODIMENTS

In exemplary embodiments of the present invention, the addition function of a full-adder will be used to illustrate the significant advantages which can be realized by the present invention. In accordance with an exemplary embodiment, the addition function is separated into two logical functions: a first function designated herein as a carry function, and a second function designated herein as a sum function. In accordance with exemplary embodiments of the present invention, two separately phased clocks ph1 and ph1d are generated from a single clock and used to separately clock the carry function and the sum function in any number of cascaded stages.

For example, FIG. 1 shows an apparatus for logically combining digital logic values, the apparatus being generally designated as a logic cell 100. Where the apparatus 100 is a logic cell for adding input signals, it includes a means for performing a first function, generally designated as a carry function performing means 200, and a means for performing a second function, generally designated as a sum function performing means 300.

The means for performing a carry function and the means for performing a sum function receive input signals via an input means 102. As illustrated in FIG. 1, three signal inputs labelled A, B and C are provided as inputs to the carry function performing means and the sum function performing means. The carry function performing means produces a carry output 104 labelled C'. The sum function performing means produces a sum output 106 labelled S'.

In an exemplary embodiment, the carry function performing means and the sum function performing means are both comprised of n-channel MOS transistors. Accordingly, the carry function performing means 200 receives a pull-up signal via a p-channel pull-up transistor 108. Similarly, a p-channel pull-up transistor 110 is provided for pull-up of the sum function performing means.

The pull-up transistors are used during a pre-charge phase of the logic cell 100 to hard-drive the carry output 104 and the sum output 106 to a logic high (i.e., logic 1). An evaluation phase is then initiated after the pre-charge phase is complete. During the evaluation phase, the logical functions of the carry function performing means and the sum function performing means can be used to initiate a transition of the carry signal and/or the sum signal to a logic level low (i.e., logic 0).

The transition of the carry and/or sum signals to a logic high during the pre-charge phase and the provision of a stabilized logic condition (i.e., stabilized high impedance state or stabilized logic low) during the evaluation phase constitutes a legal logic condition for n-channel MOS logic. As referenced herein, a "legal logic condition" constitutes a logic state which is appropriate for use by cascaded MOS logic.

In accordance with the present invention, the carry and/or the sum signal are stabilized during evaluation of the input signals A, B and C of the subsequent stage using a properly phased clock signal which propagates from stage to stage. That is, a properly phased clock signal is used to control the carry function performing means to stabilize its output for use by the sum function performing means. Further, the properly phased clocks of a given logic cell propagate to subsequent logic cells to ensure that outputs of a prior logic cell will provide stabilized inputs to the carry function performing means and the sum function performing means of a subsequent cascaded logic cell during a single clock cycle.

In addition to the pull-up transistors 108 and 110, an n-channel transistor 112 is provided for the carry function performing means to avoid a short-circuit of the n-channel transistors should the A, B and C inputs of the signal input means be driven to a logic high during the pre-charge phase. During a subsequent evaluation phase of the carry function performing means, the n-channel transistor 112 turns on a ground path for the carry function performing means. A similar n-channel transistor 114 is provided for the sum function performing means to prevent a short circuit therein during a pre-charge phase.

In accordance with a significant feature of the present invention, the separately phased clocks labelled ph1 and ph1d are provided on clock lines labelled 116 and 118, respectively in FIG. 1. In an exemplary embodiment, the ph1d clock signal is a delayed version of the ph1 clock. Further, the delay of this clock is equal to or greater than the worst case delay associated with a transitioning of input signals through the carry function performing means 200 during an evaluation phase (i.e., the delay of the slowest path through the carry function performing means). The significance of this delay period and the operation of the FIG. 1 circuit will be described in detail. However, before providing a description of this operation, reference is made to FIG. 2 wherein details of an exemplary carry function performing means are illustrated.

As shown in FIG. 2, the carry function performing means 200 includes various input nodes for receiving the A, B and C inputs. As shown in FIG. 2, the A and C inputs are received by a pair of serially connected n-channel CMOS transistors labelled 202 and 204 to provide a logic AND combination of the A and C signals. A second pair of parallel n-channel CMOS transistors labelled 206 and 208 also receive the A and C signals respectively, and are each serially connected with a fifth n-channel CMOS transistor 210 that receives the B input signal. This configuration provides a logical AND of the A and B signals, and a logical AND of the B and C signals. Further, the FIG. 2 configuration logically ORs each of the ANDed combinations.

A pull-up node labelled 212 in FIG. 2 is pulled-up by the p-channel pull-up transistor 108 of FIG. 1 during the pre-charge phase, and a node 214 provides a selectively activated path to ground via the n-channel transistor 112, as described with respect to FIG. 1. Because CMOS logic is used in the FIG. 2 embodiment, an inherent inversion of the carry signal output by the carry function performing means occurs. Thus, the carry function performing means performs, in accordance with an exemplary embodiment, the following evaluation of the input signals A, B and C:

$$CARRY = \overline{A \cdot B + B \cdot C + C \cdot A}$$

FIG. 3 shows an exemplary embodiment of the FIG. 1 sum function performing means 300. As shown in FIG. 3, the input signals A, B and C are received at various input nodes of the sum function performing means 300. More particularly, the A signal is input to an n-channel transistor 302 and to an n-channel transistor 304. The B signal is input to an n-channel transistor 306 and to an n-channel transistor 308. The C signal is input to a pair of n-channel transistors labelled 310 and 312. A node 314 is connected to the pull-up p-channel transistor 110 of FIG. 1 for pre-charging the FIG. 3 configuration, and a node 316 provides a path to ground via the n-channel transistor 114 of FIG. 1.

In addition to receiving the input signals A, B and C, the sum function performing means 300 also receives the carry output signal of the carry function performing means. This signal is labelled in FIG. 3 as Co, which signal is input to an n-channel transistor 318. Given the serial and parallel relationships of the n-channel CMOS transistors 302–318, the FIG. 3 sum function performing means performs, in an exemplary embodiment, the logical function of:

$$SUM = \overline{CARRY \cdot (A+B+C) + A \cdot B \cdot C}$$

Because the addition function has the property $$f(\overline{A},\overline{B},\overline{C}) = \overline{f(A,B,C)}$$

the FIG. 1 logic cell 100 can be cascaded with other similar logic cells without requiring inverters on the carry and sum outputs. That is, the FIG. 1 logic cell produces stabilized carry and sum outputs which are logically correct (i.e., legal) for implementing true domino logic.

To ensure the existence of legal logic conditions at the carry output and sum output of the FIG. 1 logic cell, the separately phased clocks ph1 and ph1d are used to separately clock (i.e., gate) the carry function performing means and the sum function performing means. An exemplary circuit which can be used for producing either a clock signal ph1 or a delayed clock ph1d is illustrated in FIG. 4.

The FIG. 4 clock circuit can be included in each of the carry function performing means and the sum function performing means described with respect to the FIG. 1 logic cell. The FIG. 4 clock circuit is generally designated 400, and includes means for receiving a system clock designated phi and means for providing either a first clock ph1 as a carry signal clock or means for providing a second clock ph1d as a sum signal clock. The FIG. 4 clock circuit includes means for delaying one of the first and second clock signals relative to the other by a predetermined delay time.

As referenced herein, the "predetermined delay time" represents a time sufficient to ensure that a stable output is available for evaluation by a subsequent logic function. In the exemplary logic cell of FIG. 1, the same delay means of the clock circuit in the carry function performing means can be used for the clock circuit of the sum function performing means. Alternately, a separate delay means can be used for the clock circuit of the sum function providing means, provided the stability requirements of the present invention are satisfied. A clock circuit of the sum function performing means can be used to produce a delayed clock for use in generating a first clock signal (i.e. ph1) of a cascaded logic stage.

In accordance with an exemplary embodiment, the FIG. 4 delaying means includes a p-channel pull-up transistor 402 for receiving a clock signal (i.e., clock ph1) from the carry signal clock providing means. Further, the delaying means includes a pull-down circuit 404 which includes a pair of serially connected n-channel MOS transistors labelled 406 and 408. The gates of the p-channel transistor 402 and the n-channel transistor 408 are connected to a means for providing a system clock phi.

Where a plurality of the FIG. 1 logic cells are cascaded, the n-channel transistor 406 receives a clock signal from a previous stage. That is, the plural clock signals of plural stages are sequentially connected to provide a clock signal which ripples through the cascaded logic cells to implement domino logic. The first stage of a cascaded adder (i.e., an adder implemented using a plurality of the FIG. 1 logic cells) would have the gate labelled "a" of the n-channel transistor 406, representing a clock drive input, tied to a logic level high signal. The source of the p-channel transistor 402 and the drain of the n-channel transistor 406 are connected to an inverter 410 for producing a delayed clock signal labelled Z on output line 412 of FIG. 4.

FIG. 4 represents an exemplary delay means for producing the carry signal clock ph1 and the delayed sum signal clock ph1d of FIG. 1. Those skilled in the art will appreciate that other configurations of the delay circuit can be configured. For example, the two transistor pull-down circuit 404 could be replaced by any pull-down circuit, including pull-down circuits formed with a single transistor. Further, the p-channel pull-up transistor 402 could be replaced with an n-channel transistor which is functionally equivalent to the p-channel transistor illustrated.

In addition, alternate clock circuits can be used to provide different delay periods. For example, since the delay produced by the FIG. 4 clock circuit should be equal to or greater than that of the carry signal providing means, a replica of the carry function performing means can be used to delay the clock ph1 (i.e., the clock signal ph1 can be propagated through the replicated carry function performing means). The output of the carry function performing means used to produce the delay would then ensure the production of a delayed clock signal having a delay that corresponds to propagation of the input signals A, B and C through the carry function performing means 200 of FIG. 1.

In accordance with the operation of the present invention, the use of separately phased clocks for the carry function performing means and the sum function performing means of the FIG. 1 apparatus avoids the problems associated with the use of negative logic terms during the evaluation phase. However, because the separately phased clock signals are derived from the same clock signal, and because the FIG. 1 logic cell produces stable, logically correct outputs, a plurality of the FIG. 1 logic cells can be cascaded for evaluating the input signals during a single clock cycle, as a single clock pulse ripples through the cascaded logic cells.

Those skilled in the art will appreciate that the present invention is not limited to adder circuits such as the full-adder circuit illustrated in FIG. 1. Rather, adder circuits are merely considered to be one exemplary application of the use of negative logic in accordance with the present invention to reduce a function into sub-function components having domino logic capabilities with MOS technology. The present invention is equally applicable to implementing any logical functions which can be broken down into sub-functions. In this regard, it is significant to note that the invention can also be applicable to situations where a function is broken into sub-functions, wherein an inverted output of a first sub-function is used as an input to a second sub-function.

Further, logic cells designed in accordance with the present invention would be useful for any circuit having a regular architecture wherein the use of negative logic terms is desired, but in which the use of negative logic terms requires that outputs of the negative logic be stabilized before they are input to a subsequent stage. For example, the present invention would be equally applicable to using full-adder logic cells to implement multiplier circuits.

As described above, the present invention provides significant advantages. For example, the present invention can expand the use of domino logic to situations where negative logic terms can be used without requiring the increased space and power consumption requirements of conventional techniques. Using domino logic, a relatively complex function can be evaluated in a single-slower clock cycle, using less structure, and resulting in less power dissipation and reduced area requirements.

In operation of the FIG. 1 circuit, two general phases of operation occur: a first pre-charge phase and a subsequent evaluation phase. During the pre-charge phase, the evaluation circuits represented by the carry function performing means and the sum function performing means are hard-driven to a predetermined logic state (e.g., to a logic level high, or 1). During the subsequent evaluation phase, the input signals A, B and C in FIG. 1 are processed by the carry function performing means and the sum function performing means in accordance with the logic configuration included in each of these means.

Conventional domino logic requires that a cascaded n-channel block receive input signals which transition from a logic 0 to a logic 1. To implement a full-adder with n-channel MOS transistors and still provide a domino logic capability, this requirement must be addressed. However, during an evaluation phase, the negative logic included in the carry function performing means and the sum function performing means can produce output signals which would violate this constraint. (For a p-channel block in a full-adder, the output must transition from a 1 to a 0 during an evaluation phase in order to turn on a p-channel transistor in a subsequent stage so that the 0 will propagate through that stage.)

In accordance with the present invention, this obstacle is avoided by using the separately phased clocks ph1 and ph1d for the carry function performing means and the sum function performing means, respectively. By controlling the phasing of these two clocks, output signals from any negative logic can be stabilized before being input to a function block within a given logic cell, or input to another logic cell of a cascaded stage.

For example, the use of a delayed clock for the sum function performing means, wherein the delay is equal to or greater than the delay of the carry function performing means, will provide a stabilized output of the carry function performing means before being input for evaluation in the sum function performing means of the FIG. 1 logic cell. This stabilized output from the carry function performing means ensures that the sum function performing means operates on the correct logic values at each of its four FIG. 1 inputs. The proper phasing of the separate clocks provided in accordance with the present invention ensures that legal conditions exist before the sum function performing means of a given logic cell evaluates input signals received at its input, and further ensures that legal outputs will be produced by the FIG. 1 logic cell for input to a subsequent stage in a domino logic configuration.

By cascading a plurality of the FIG. 1 logic cells and including a clock delay circuit for each cascaded stage, the same clock signal can be propagated through the cascaded logic cells. In this manner, a single clock cycle can be used to perform a relatively complex evaluation function.

FIGS. 6a and 6b illustrate how multiple stages of the FIG. 1 logic cell can be cascaded for operation over a single clock cycle. Each carry function performing means and each sum function performing means is provided with a clock delay circuit as illustrated in FIG. 4.

In an exemplary configuration, the system clock labelled A of FIG. 6a is connected to each system clock signal input (i.e., phi) in the clock delay circuits of all cascaded logic cells. Thus, the system clock is received at the clock circuit of the carry function performing means of the first logic cells 602 illustrated in FIG. 6b. The clock drive input "a" for the clock circuit in the carry function performing means of the first logic cells 602 is tied to a logic high to produce waveform B of FIG. 6a as the ph1 clock signal for these logic cells. The clock circuit of the sum function performing means receives the waveform B at its "a" input to produce a Z output representing the clock ph1d (waveform C in FIG. 6a) for the sum function performing means of the logic cells 602 (see FIG. 6b).

The clock drive input "a" of the carry function performing means in subsequent logic cells 604 also receives the waveform C to produce the waveform D in FIG. 6a as the clock ph1 of the cascaded logic cells 604. The clock drive input "a" of the sum function performing means in the cascaded logic cells 604 also receives the waveform D and delays this waveform to produce the waveform E as a delayed clock ph1d.

The Z output of the cascaded sum function performing means (i.e., waveform E) is also input to the clock drive input "a" of the carry function performing means in the cascaded logic cells 606 to produce the waveform F as the clock signal ph1 for the logic cells 606. The clock circuit for the sum function performing of the cascaded cells 606 delays the waveform F to produce a ph1d clock for the sum function performing means. Thus, the first logic cells 602, the cascaded logic cells 604, and the subsequent cascaded logic cells 606 can all perform evaluations during a single clock cycle, after which another pre-charge phase can be initiated.

FIG. 5 shows an implementation of the FIG. 1 apparatus in connection with an exemplary integrated circuit chip. The integrated circuit is generally labelled 500 in FIG. 5, and can be seen to include a carry function performing means 200 and a sum function performing means 300. In FIG. 5, the input means is labelled 502, and receives input signals labelled C3, NX2 and S3. These input signals are provided to both the carry function performing means 200 and the sum function performing means 300. An output means labelled 504 produces a carry output signal C5 on line 506 and a sum output S5 on line 508. The output means 504 further includes an inverter 510 for the carry output signal and an inverter 512 for the sum output signal. In addition to receiving the input signals C3, NX2 and S3, the sum function performing means 300 also receives a carry output signal C5 via a line 514.

The FIG. 5 implementation also includes the aforementioned separately phased clock signals. The carry signal clock is labelled ph5-So, and is received on line 516. A delayed version of the carry signal clock is labelled ph5d-So, and is input to the sum function performing means via a line 518.

As described with respect to FIG. 1, a p-channel pull-up transistor 520 is provided for the sum function performing means 300, as is a pull-down n-channel transistor 522. The carry function performing means includes a pull-up p-channel transistor 536, and a pull-down n-channel transistor 524.

The FIG. 5 implementation also includes a multiplexer function such that the input signals C3 and S3 can be passed directly to the output of the FIG. 5 circuit, or alternately, subjected to an addition function in the carry function performing means and the sum function performing means. In accordance with an exemplary embodiment of a multiplexer combined with the digital logic cell of FIG. 1, the FIG. 5 implementation includes a multiplexer labelled 526. The multiplexer 526 includes a pair of n-channel MOS transistors 528 and 530 for either selecting the carry output signal from the carry function performing means 200 or for passing the input signal C3 directly to the output 506 of the FIG. 5 circuit. The multiplexer 526 further includes a pair of n-channel transistors 532 and 534 for either selecting the sum function performing means output signal or for passing the input signal S3 directly to the output 508. The multiplexer 526 is controlled in response to a select signal ph5-S1 received on line 538. A pull-up control signal ph5 is received on line 540.

While the exemplary embodiments described herein have been discussed with respect to CMOS configurations, those skilled in the art will appreciate that other transistor technologies can be used in accordance with the present invention. For example, any or all of the n-channel transistors described above could be replaced with p-channel transistors (e.g., the sum function performing means and the carry function performing means could be implemented with p-channel transistors). Further, although the present invention can be used with regular array structures, those skilled in the art will appreciate that it can be used with random array structures as well.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Apparatus for logically combining digital logic values comprising:
   an input means for receiving input signals to be evaluated;
   means for performing a first function on said input signals;
   means for performing a second function on said input signals;
   means for providing a first clock signal for said first function performing means and a second clock signal for said second function performing means; and means for delaying one of said first and second clock signals relative to the other of said first and second clock signals by a predetermined delay time, wherein said first function performing means, said second function performing means, said clock signal providing means and said delaying means constitute a cell, and a plurality of said cells are cascaded in series for operation during a single clock cycle.

2. Apparatus according to claim 1, wherein said apparatus is a digital adder, said first function performing means provides a carry function and said second function performing means receives an output of said carry function in conjunction with said input signals to provide a sum function, said first clock signal being a carry signal clock which is delayed by said predetermined delay time to provide said second signal clock.

3. Apparatus according to claim 2, wherein said predetermined delay time is a worst case delay through said carry function performing means.

4. Apparatus according to claim 2, wherein said predetermined delay time corresponds to a delay time of said carry function performing means.

5. Apparatus according to claim 2, wherein said carry function performing means and said sum function performing means are formed with n-channel MOS transistors.

6. Apparatus according to claim 2, wherein said carry function performing means and said sum function performing means are formed with p-channel MOS transistors.

7. Apparatus according to claim 2, wherein said predetermined delay time is greater than a delay time of said carry function performing means.

8. Apparatus according to claim 1, wherein said delaying means includes a pull-up circuit and a pull-down circuit.

9. Apparatus according to claim 2, wherein said input means, said carry function performing means, said sum function performing means, said clock signal providing means and said delaying means constitute a full-adder cell, and a plurality of said full-adder cells are cascaded in series for operation during said single clock cycle.

10. A clock circuit for use in a domino logic cell implemented with negative logic, said clock circuit comprising:
means for providing a first clock signal;
means for providing a second clock; signal and
means for delaying said first clock signal to produce said second clock signal, wherein said first clock signal providing means, said second clock signal providing means and said delaying means constitute a cell of said domino logic, a plurality of said cells being cascaded in series for operation during a single clock cycle.

11. A clock circuit according to claim 10, wherein said delaying means delays said first clock signal such that a function initiated by said second clock signal will receive stable inputs from a function initiated by said first clock signal.

12. An apparatus for implementing a logical function comprising:
means for performing a first function;
means for performing a second function, said second function performing means being cascaded with said first function performing means to form a cell, at least one of said first and second function performing means including a negative logic term with a plurality of said cells being cascaded in series; and
means for clocking input signals through said first function performing means and said second cascaded function performing means of said plurality of cells using a single clock cycle.

13. Apparatus according to claim 12, wherein at least one of said first and second function performing means is implemented using MOS transistors.

14. Apparatus according to claim 12, wherein said first function performing means and said second function performing means perform the same logical function.

15. Apparatus according to claim 12, wherein said first function performing means and said second function performing means perform different logical functions.

16. Apparatus according to claim 12, wherein said clocking means produces a clock signal, a first phase of said clock signal being used to gate said first function performing means, and a delayed phase of said clock signal being used to gate said second function performing means.

17. Apparatus according to claim 16, wherein said clocking means further includes:
means for delaying said clock signal with a predetermined delay to provide said delayed phase.

18. Apparatus according to claim 16, wherein said predetermined delay corresponds to a worst case delay through one of said first and second function performing means.

* * * * *